United States Patent [19]

Garde

[11] 4,121,172
[45] Oct. 17, 1978

[54] DUAL LOOP PHASE LOCKED OSCILLATOR SYSTEM

[75] Inventor: Lawrence Garde, Bloomington, Minn.

[73] Assignee: Magnetic Peripherals Inc., Minneapolis, Minn.

[21] Appl. No.: 850,885

[22] Filed: Nov. 14, 1977

[51] Int. Cl.² .............................................. H03B 3/04
[52] U.S. Cl. .................................. 331/1 A; 328/155; 331/2; 331/25; 360/51
[58] Field of Search ..................... 331/1 A, 2, 18, 25; 328/155; 360/51

[56] References Cited

U.S. PATENT DOCUMENTS 3,662,277  5/1972  White ........................................ 331/2
3,701,039  10/1972  Lang et al. ........................... 331/1 A Primary Examiner—Siegfried H. Grimm
Attorney, Agent, or Firm—Robert M. Angus

[57] ABSTRACT

A dual loop phase locked oscillator system comprises a pair of phase locked oscillators coupled with priority logic gates for selectively operating each oscillator. During a lock-to-data mode, the logic gates are operated so that one of the oscillators is operated by the input data to lock to the data rate, while the other oscillator is operated by the output of the first oscillator to also lock to the data rate. During a normal mode, or coasting mode (when no data is present), each oscillator operates off the output of the other to thereby maintain oscillation at the data rate. Thus, the oscillators are selectively operated in tandem or in parallel.

16 Claims, 11 Drawing Figures

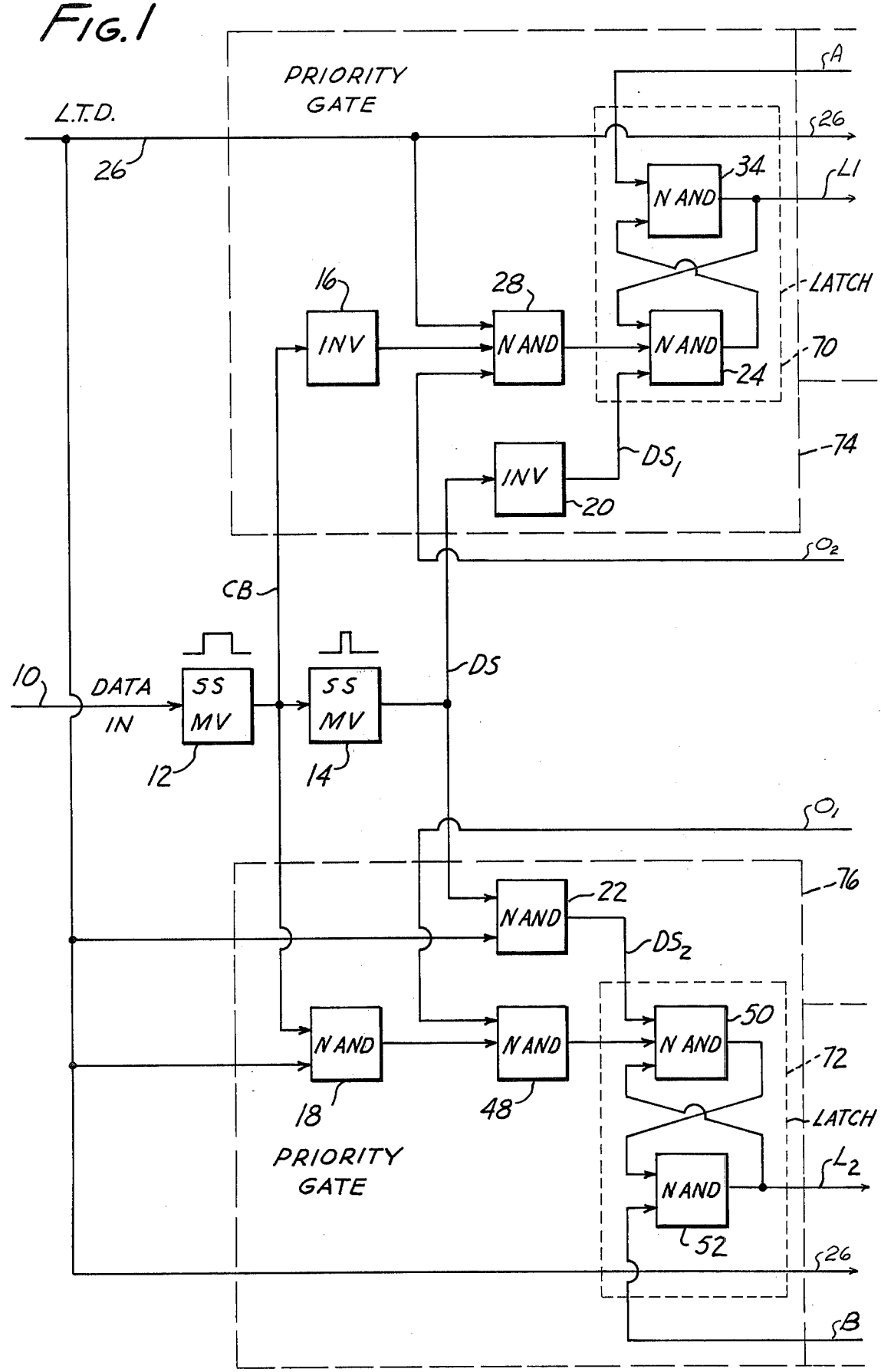

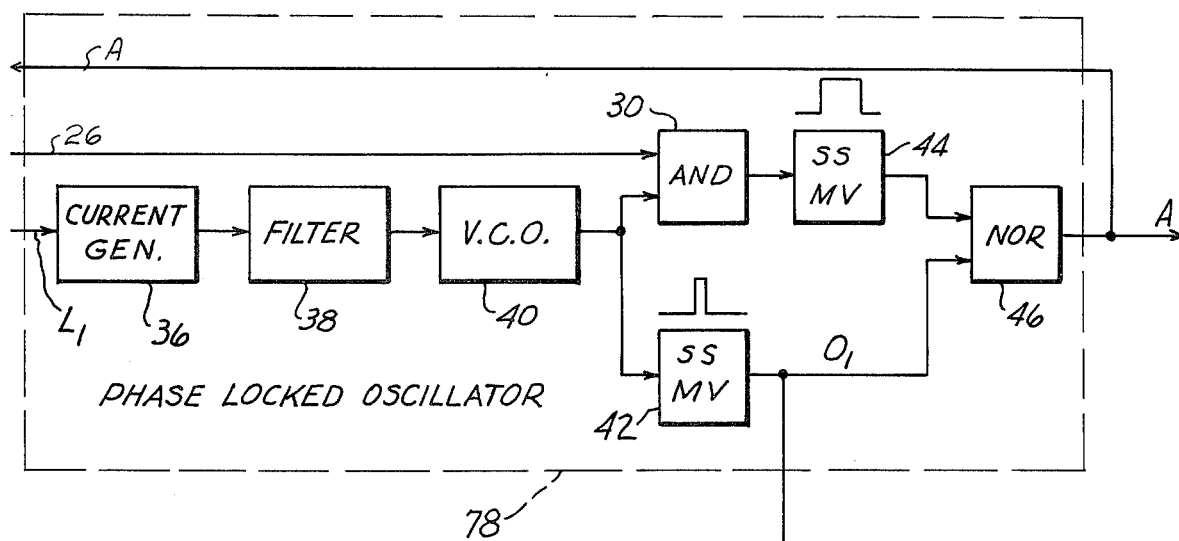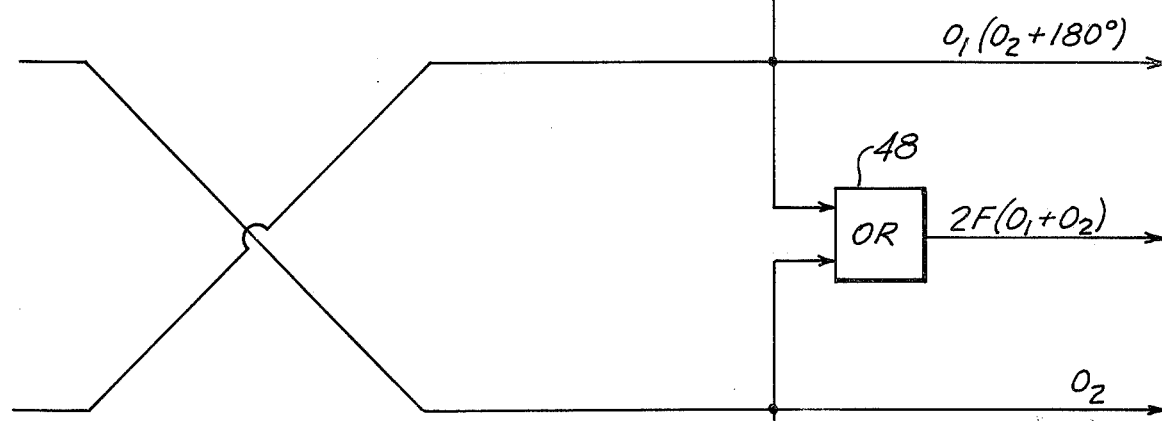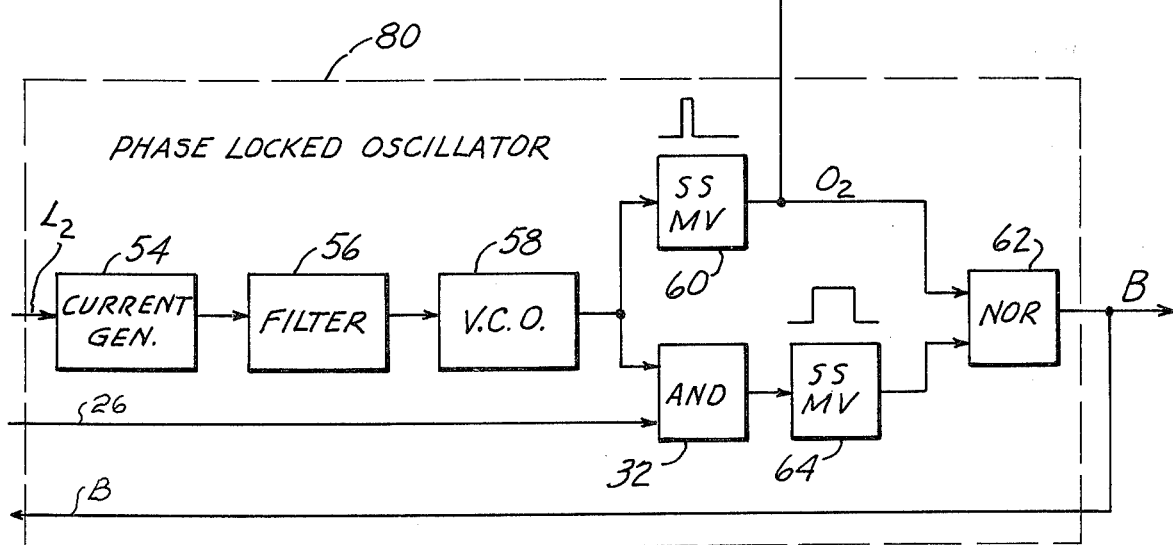
FIG. 1A

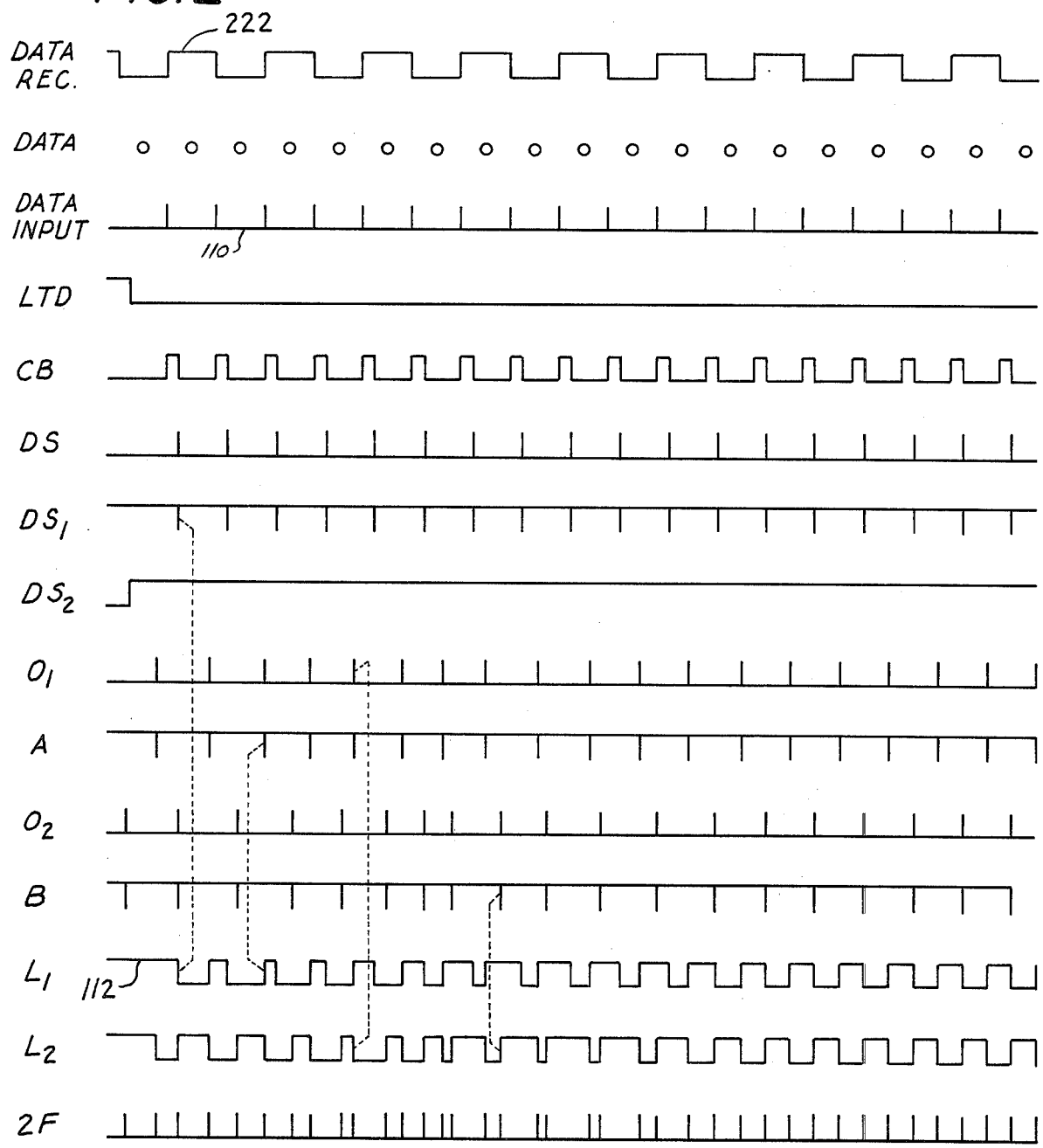

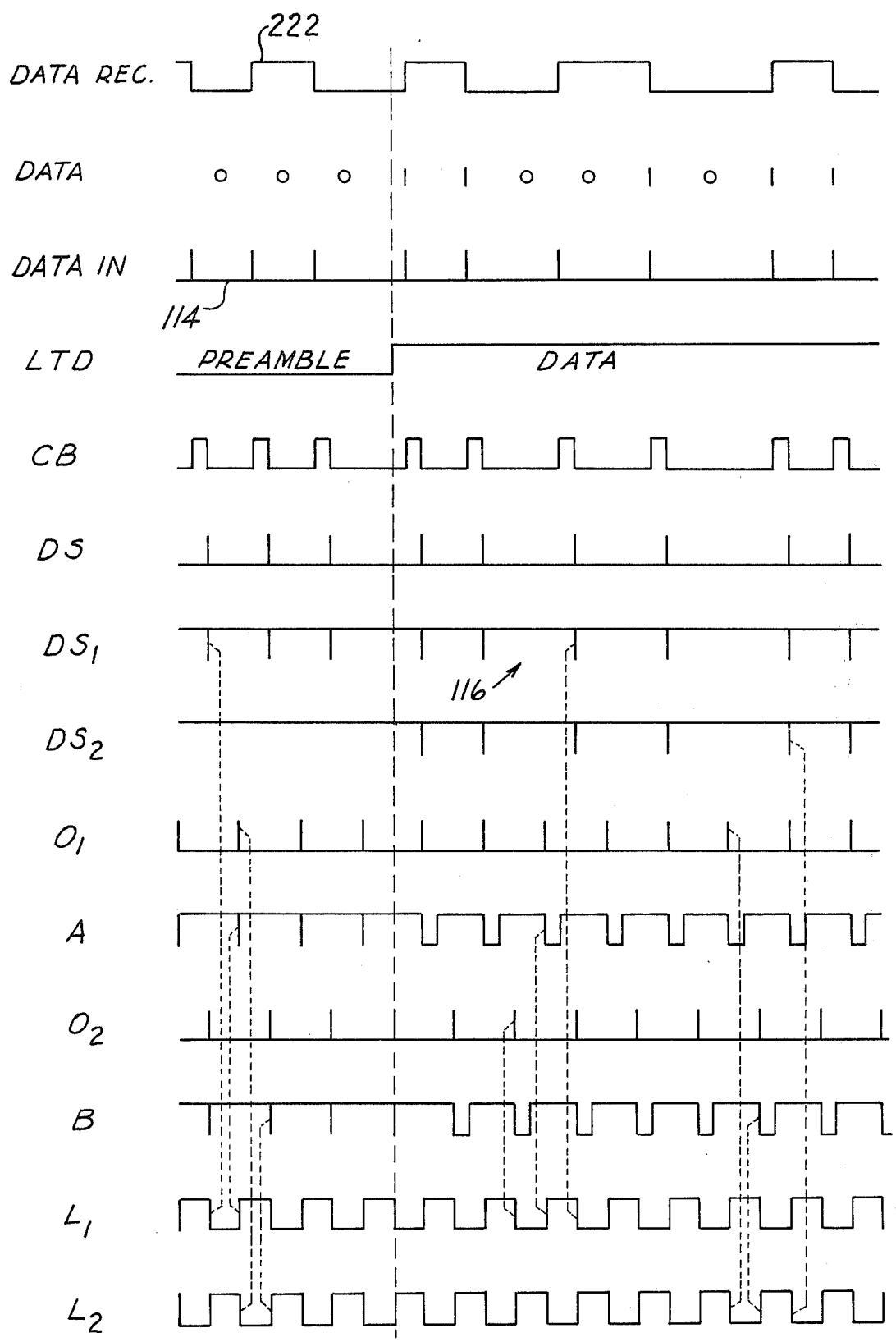

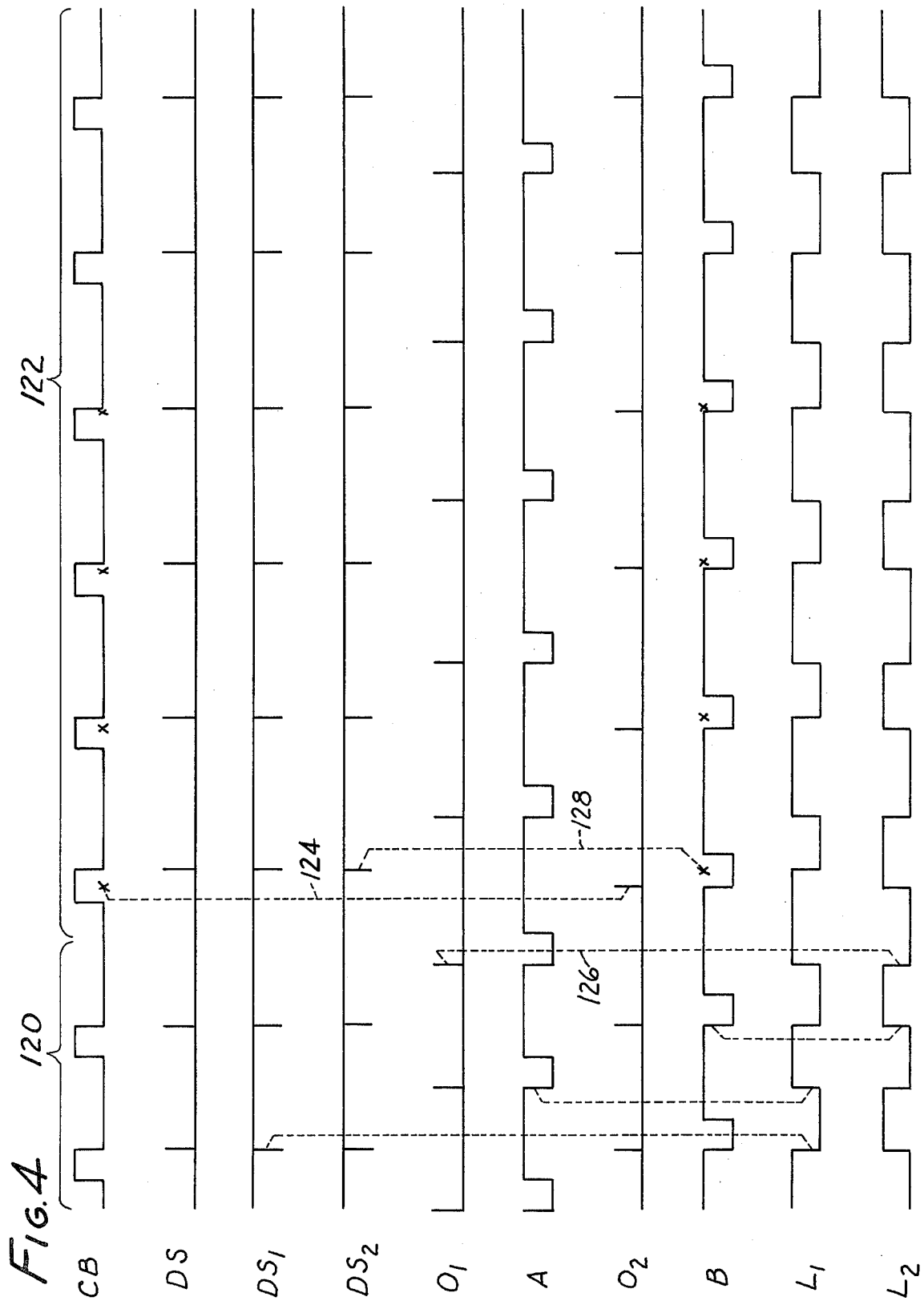

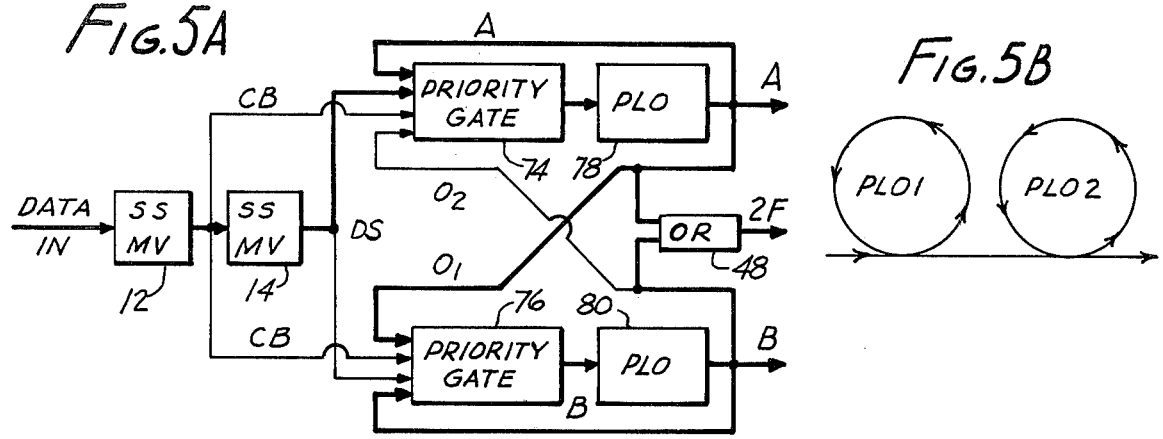
FIG.5A
FIG.5B
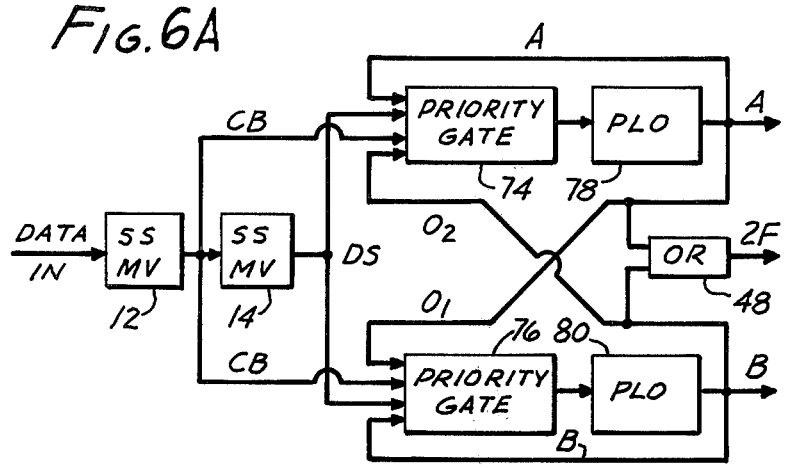
FIG.6A
FIG.6B
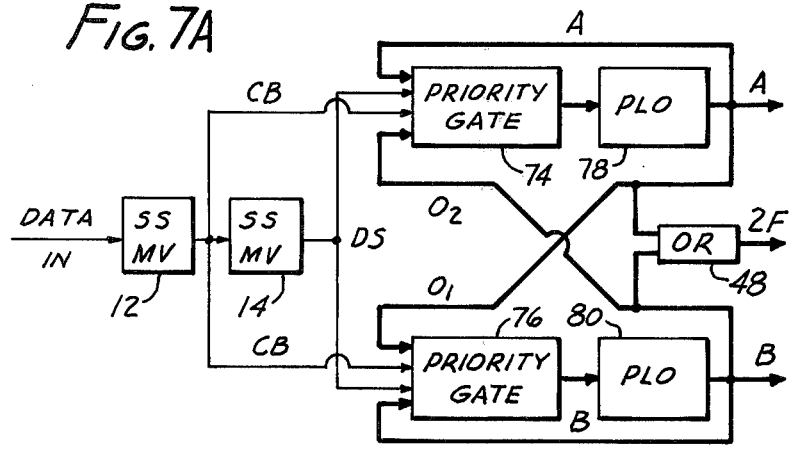
FIG.7A
FIG.7B

DUAL LOOP PHASE LOCKED OSCILLATOR SYSTEM

This invention relates to phase locked oscillators, and particularly to dual looped phase locked oscillators for deriving clock signals. In particular, the present invention relates to a double looped phase locked oscillator for deriving clock signals useful in connection with data recovery and to provide clock signals useful in connection with data storage.

It is common in the computer arts to provide magnetic media, such as magnetic disk storage systems, for storing data. As the state of the art of magnetic disk systems has advanced, the density of data stored on the magnetic media has increased, thereby reducing track widths and increasing data transfer and recovery rates. As the desire for increasing data density on magnetic media has increased, a growing need has been felt for accurate clock generation apparatus for synchronizing to the increased frequency of the data during the recovery period. It is common to provide a clock signal at a recovery rate of approximately twice the frequency of the data recovered. Thus, if the data rate is 10.7 MHz, a clock signal at a frequency of 21.4 MHz is required, thereby providing a data window of 51.5 ns. It is common in the data recovery art to provide phase locked oscillators for locking onto the phase and frequency of the data being recovered. However, with the increased data density and recovery rates, it has not been possible to economically construct a phase locked oscillator which is linear over the range of frequencies expected, especially at higher frequencies.

Similarly, in the data storage art it is common to provide a clock signal generator operating at a multiple of the frequency of the rate at which the data is to be stored. As in the case of the data recovery art, it has not been economically feasible to construct clock signal oscillators capable of a linear response over the frequency range desired, especially at higher frequencies.

Data encoding systems for recording and retrieving data ordinarily are limited to a bandwidth between the fundamental of the data frequency and one-half that frequency. For example, using a MFM code system, data is ordinarily recorded as transitions in pulses which a transition occurring between consecutive binary "0"s and coincident with binary "1"s. Therefore, the highest data frequency will be represented by all binary "1"s or "0"s, whereas a binary code of 101010101... will produce a transition frequency of one-half of the highest.

Since the number of transitions capable of being recorded is limited, encoding systems for handling more data per transition are being developed. To provide the increased data capability, the bandwidth must be wider to permit the inclusion of subharmonic frequencies, below the fundamental frequency. However, these increased bandwidths also result in longer periods between some transitions of the data pulse stream. During these periods between transitions, there is a tendency for the phase angle between the data pulses and the clock pulses derived by the phase locked oscillator to drift, thereby creating the possibility of error. This drift is due in part by the absence of data pulses to sustain the oscillation frequency of the phase locked oscillator, as well as slight unbalances in the oscillator components due to voltage supply fluctuation, component tolerances and environmental conditions (e.g., temperature, etc.).

The present invention is particularly concerned with a plurality of phase locked oscillators arranged with priority gates for selective operation in tandem or in parallel for accurately locking to the frequency of input data and for maintaining that frequency during periods which data might not be present.

It is an object of the present invention to provide a phase locked oscillator system capable of operating over a wide range of frequencies yet which is linear in response and accurately locks to the frequency of the data being recovered.

Another feature of the present invention resides in the fact that the phase locked oscillators may "coast" in the sense that input data is not necessary to sustain the oscillation so that each phase locked oscillator may be phase locked to the output of the other, each being 180° out of phase from the other.

One feature of the present invention resides in the fact that the magnitude of phase drift is greatly reduced because during "coasting" conditions when no data is present, the time constants of the oscillators are effectively cascaded so that any phase drift is extended over longer periods of time than would be associated with prior oscillator systems. This feature permits wider bandwidth encoding without the tendency to drift in phase or frequency.

Another feature of the present invention resides in the use of the dual looped phase locked oscillator to serve as a frequency multiplier whereby the phase locked oscillators may be locked to a high frequency input and sustained with a signal input at a subharmonic of the first input frequency.

Another feature of the present invention resides in the use of the apparatus to provide a continuous clock signal for use with servo on data. In this respect, upon establishing a predetermined clock frequency, the apparatus may be operated in a "coast" mode to provide accurate clock signals at a prescribed rate for read or write purposes.

Although the present invention will be described in connection with MFM code systems (a system wherein recorded data transitions occur between consecutive "0"s as well as coincident with binary "1"s), the invention is equally applicable for use with other code systems, including 3PM codes (wherein data transitions occur in accordance with formats prescribed by 3-bit bytes — see Jacoby, "A New Look-ahead Code for Increased Data Density", IEEE Transaction on Magnetics, Vol. MAG-13, No. 5, Sept. 1977, pages 1202–1204).

The above and other features of this invention will be more fully understood from the following detailed description and the accompanying drawings, in which:

FIGS. 1 and 1A, taken together, illustrate a block circuit diagram of a dual looped phase locked oscillator in accordance with the presently preferred embodiment of the present invention;

FIG. 2 is an illustration of waveforms useful in explaining the operation of the apparatus illustrated in FIGS. 1 and 1A in connection with locking to input signal frequencies;

FIG. 3 is an illustration of waveforms useful in explaining the operation of the apparatus illustrated in FIGS. 1 and 1A in either a normal running mode or a "coast" mode;

FIG. 4 is an illustration of waveforms useful in explaining the operation of the apparatus illustrated in FIGS. 1 and 1A in a resynchronization mode;

FIGS. 5A and 5B are diagrams illustrating the operation of the apparatus illustrated in FIGS. 1 and 1A in a lock-to-data mode;

FIGS. 6A and 6B are diagrams illustrating the operation of the apparatus illustrated in FIGS. 1 and 1A in connection with a normal running mode; and FIGS. 7A and 7B are diagrams illustrating the operation of the apparatus shown in FIGS. 1 and 1A in connection with a "coast" mode.

With reference to the drawings, particularly in FIGS. 1 and 1A, there is illustrated a dual looped phase locked oscillator in accordance with the presently preferred embodiment of the present invention. The apparatus includes an input data channel 10 for inputting data to single shot multivibrator 12. The output of single shot multivibrator 12 is provided to the input of single shot multivibrator 14 and also as inputs to inverter 16 and NAND gate 18. As shown in FIG. 1, single shot multivibrator 12 provides relatively wide pulse output, sometimes hereinafter designated as the "coast blanking" (CB) signal, whereas single shot multivibrator 14 provides a relatively narrow pulse output, sometimes hereinafter referred to as the "data synch" (DS) signal. Single shot multivibrator 14 provides an output to inverter 20 and NAND gate 22. The output of inverter 20 is provided as one input to NAND gate 24, the signal appearing at the output of inverter 20 is sometimes hereafter referred to as the $DS_1$ signal.

A lock-to-data (LTD) signal is provided via channel 26 to NAND gates 18, 22 and 28, and to AND gates 30 and 32. NAND gate 28 provides an output to NAND gate 24, which in turns provides an output to NAND gate 34. The output of NAND gate 34 is provided as a latch signal ($L_1$) to current generator 36 and also as a third input to NAND gate 24. Current generator 36 provides an output to filter 38 which in turns provides an output to voltage controlled oscillator 40 which provides outputs to AND gate 30 and single shot multivibrator 42. The output of single shot multivibrator 42 is designated as the "$O_1$" output signal and is, as will be hereinafter explained, ordinarily 180° out of phase with the DS signal. The output of AND gate 30 is provided to single shot multivibrator 44 which in turn provides an input to NOR gate 46 which in turn provides an output signal "A". The output of single shot multivibrator 42 is also provided as an input to NOR gate 46 and is provided as an input to OR gate 48. The output from NOR gate 46 is fed back as a second input to NAND gate 34.

NAND gat 48 receives inputs from NAND gate 18 as well as $O_1$ signals from single shot multivibrator 42. The signal from NAND gate 48 and the $DS_2$ signal from NAND gate 22 are provided as inputs to NAND gate 50 which in turn provides an output to NAND gate 52. NAND gate 52 provides a latch signal ($L_2$) to NAND gate 50 as well as to current generator 54. Current generator 54 provides an output to filter 56 which in turn provides an output to voltage controlled oscillator 58 which in turn provides an output to single shot multivibrator 60 as well as to AND gate 32. The output from single shot multivibrator 60 is provided as a second input to OR gate 48 as well as an input to NOR gate 62. Also, the $O_2$ output from single shot multivibrator 60 is provided as a third input to NAND gate 28. AND gate 32 provides an output to single shot multivibrator 64 which in turn provides a second input for NOR gate 62. NOR gate 62 provides a "B" output signal which is fed back as a second input to NAND gate 52. It is preferred that single shot multivibrators 12, 44 and 64 produce pulse widths equal to about one-quarter cycle at the highest expected data rate, whereas single shot multivibrators 14, 42 and 60 produce pulse widths equal to about one-quarter of that produced by multivibrators 12, 44 and 64.

The NAND gates as herein described and shown operate to provide binary "1" outputs when any input is a binary "0" and provides a binary "0" output when all inputs are binary "1"s as will be apparent to those skilled in the art. NAND gates 24 and 34 are wired together to form a latch circuit 70, and NAND gates 50 and 52 likewise form a latch circuit 72. Latch circuit 70, together with inverters 16 and 20 and NAND gate 28 form a priority gate 74 whereas latch circuit 72 together with NAND gates 18, 22 and 48 form priority gate 76. Also as will be evident to those skilled in the art, current generator 36, filter 38 and voltage controlled oscillator 40 form a standard phase locked oscillator. The additional circuitry on the output of the phase locked oscillator 40 provides certain logic controls useful to the present invention and, together with the standard portions of the phase locked oscillator, are sometimes hereinafter designated phase locked oscillator 78. Similarly, current generator 54, filter 56 and voltage controlled oscillator 58 form a standard phase locked oscillator which, together with the logic circuitry at the output of the voltage controlled oscillator 58, are sometimes hereinafter designated phase locked oscillator 80.

As will be more fully understood hereinafter, single shot multivibrators 14, 42 and 60 provide output pulses for a relatively short duration whereas single shot multivibrators 12, 44 and 64 provide pulses of a relatively long duration. Further, as will be more fully understood hereinafter, the signals $O_1$ and $O_2$ are 180° out of phase and signal $O_2$ is in phase with signal DS.

The operation of the latch circuits 70 and 72 may be explained with particular reference to latch circuit 70. Assuming all inputs to NAND gate 24 are at binary "1" (a condition which will occur when NAND gate 28 provides a binary "1" output, $L_1$ is binary "1" and $DS_1$ is binary "1" — due to a binary "0" value to DS), gate 24 provides a binary "0" output to NAND gate 34 to condition the gate to provide a binary "1" output for signal $L_1$. Thus, the binary "1" from signal $L_1$ is imposed on gate 24 to meet the condition mentioned above. When one of the signals $DS_1$ or that from NAND gate 28 goes to binary "0" (as might be occassioned by the presence of an inverted DS pulse), gate 24 is forced to a binary "1" output. Signal $L_1$ switches to binary "0" thereby forcing gate 24 to hold the binary "1". Thereafter, return of the binary "1" values to the other inputs of gate 24 will not affect operation. However, when signal "A" subsequently becomes binary "0", gate 34 is operated to provide a "1" output for signal $L_1$ and returning the third input for gate 24 to binary "1", thereby forcing NAND gate 24 to produce a binary "0" output.

During the lock-to-data mode, signal LTD is at binary "0", thereby conditioning NAND gate 28 to provide a continuous "1" output to gate 24. Therefore, during lock-to-data, latch 70 is conditioned to provide the $L_1$ signal having a binary "1" value when signal "A" goes to binary "0" value and to provide the $L_1$ signal having a binary "0" value when $DS_1$ goes to binary "0" (or when DS goes to "1"). During normal run, signal LTD is at a binary "1" value, so signal $L_1$ will switch to binary "1" when signal "A" goes to binary "0" and will switch to binary "0" when either the $DS_1$ signal goes to binary "0" or the $O_2$ signal goes to binary "1". (As is explained herein, during normal mode the $O_2$ signal will occur when the CB signal is "0" so all inputs to NAND gate 28 will be set to "1" when signal $O_2$ goes to "1" thereby providing a "0" binary input for NAND gate 24.)

During lock-to-data mode, when LTD is at binary "0", NAND gates 18 and 22 are conditioned to provide a continuous binary "1" output (due to the "0" binary value to signal LTD). Therefore, signal $DS_2$ is set to "0". However, when signal $O_1$ provides a binary "1" signal to NAND gate 48, the latch 72 will provide a signal output $L_2$ having a binary "0" value; whereas when the "B" signal provides a binary "0" to gate 52, signal $L_1$ goes to binary "1". During normal run, when LTD is at binary "1", signal $L_2$ will be set to binary "1" by a "B" signal binary value of "0", whereas signal $L_2$ will be set to binary "0" when either the $DS_2$ signal does to binary "0" or the $O_1$ signal goes to binary "1".

With the foregoing in mind, the operation of the apparatus may be readily explained.

With reference to FIGS. 1, 1A, 2, 5A and 5B, the operation of the apparatus during the "lock-to-data" mode may be explained. As shown particularly in FIG. 2, the data (or more specifically, the preammble to actual data) will consist entirely of all binary "0"s. In the magnetic media, this is recorded as a series of pulses 222 having their transition occurring between each pair of "0"s. In this respect, the data is recorded such that a transition in recorded value occurs at each binary "1" in the data and also between each pair of recorded binary "0"s. The data input to the apparatus, however, will appear as waveform 110 with a series of spike pulses occurring between each data value, and hence in synchronism with the data rate.

With the LTD signal at a low or "0" binary level, NAND gates 18, 22 and 28 are conditioned to provide continuous binary "1" outputs. Also, AND gates 30 and 32 cannot operate due to the "0" value input from the LTD signal on channel 26. Single shot multivibrator 12 responds to each pulse in waveform 110 to drive single shot multivibrator 14 to provide DS signals of a relatively short duration. (Since NAND gates 18 and 28 are locked from operation due to the LTD signal, the CB signal has no effect during lock-to-data mode.) Inverter 20 inverts the DS signals to form a $DS_1$ signal input to NAND gate 24. (Due to the "0" input from the LTD signal to NAND gate 22, NAND gate 22 will provide a continuous "1" output so that the $DS_2$ signal will appear as a continuous binary "1".) The latch circuit comprising NAND gates 24 and 34 is operable, during the lock-to-data mode, to provide a "0" binary output when NAND gate 24 receives a $DS_1$ signal having a "0" binary value, and is operable to provide a binary "1" output when NAND gate 34 receives an "A" signal having a "0" binary value. Assuming the output from voltage controlled oscillator 40 is providing an "A" signal (or $O_1$) not necessarily locked to the phase and frequency of the data input, the $O_1$ signal is forwarded via single shot multivibrator 42 to NOR gate 46 to form the "A" signal which is forwarded to the input of NAND gate 34 of latch circuit 70. Thus, the "A" signal is the inverse of the $O_1$ signal. Hence, the $L_1$ signal waveform shown at waveform 112 is derived. Waveform 112 operates current generator 36 to feed and take up current to and from filter 36 in a manner well-known in the art. The derived current is forwarded to voltage controlled oscillator 40 to produce pulses at its output, thereby altering the frequency of the $O_1$ and "A" signal. This continues until waveform 112 is stabilized to equal periods of high and low binary values in synchronism with the DS pulses. Simultaneously, the $O_1$ output is provided as an input to NAND gate 48 of priority gate 76. Assuming the voltage controlled oscillator 58 is operating at some frequency not necessarily locked to the phase and frequency of the input data, a "B" signal will be fed back to NAND gate 52. Latch circuit 72 is therefore operable, during the lock-to-data mode, to provide an $L_2$ output to current generator 54 which is set to binary "1" by a "B" output having a binary "0" value and is reset to binary "0" by an $O_1$ output having a binary "1" value.

As an inspection of the FIG. 2 waveforms associated with $O_1$, A, $L_1$, $O_2$, B and $L_2$ will reveal, after several cycles (ordinarily not more than about 20), the output signals $O_1$ and $O_2$ will eventually lock to the frequency of the input data with the $O_2$ signal being in phase with the DS signal and the $O_1$ signal being 180° out of phase with the $O_2$ and DS signals. With the apparatus locked to the data, as illustrated in FIG. 2, operation of the apparatus in a "normal" run may be explained with reference to FIGS. 1, 1A, 3, 6A and 6B. As heretofore explained, the "lock-to-data" mode will ordinarily occur during a preamble to the data to be extracted from the magnetic media.

As shown particularly in FIG. 3, data pulses 111 appear at each transition of the recorded data pulses recorded on the magnetic media. Transitions occur between consecutive zeros in the data and also coincident with binary "1"s in the data. Thus, for a data word consisting of "11001011", the data input on channel 10 will appear as shown in waveform 114 of FIG. 3. Thus, the wide CB pulse is derived from the input data which in turn forms the DS signals which are inverted by inverter 20 and forwarded to NAND gate 24. During the preamble, the DS signal formed only a $DS_1$ signal, which is an inversion of the DS signal whereas $DS_2$ signal was locked to binary "1". However, during the data or normal phase, when the LTD signal is set to binary "1", NAND gates 18, 22 and 28, and AND gates 30 and 32 are no longer inhibited. Thus, the $DS_2$ signal will appear identical to the $DS_1$ signal during the data phase, since NAND gate 22 acts essentially as an inverter during normal mode. During the lock-to-data mode the $L_1$ signal set to binary "1" during an "A" signal and reset to binary "0" during a $DS_1$ signal, whereas the $L_2$ signal set to binary "1" during a "B" signal and reset to binary "0" during an $O_1$ signal, all as heretofore explained. Assuming the $O_1$ and $O_2$ signals are locked to the data frequency, during the data mode, $L_1$ and $L_2$ will still set to binary "1" during the "A" and "B" signals, respectively, as heretofore explained, but $L_1$ will reset to binary "0" upon the occurrence of either an $O_2$ signal or a $DS_1$ signal and $L_2$ will reset to binary "0" upon the occurrence of either an $O_1$ signal or a $DS_2$ signal. (However, if a $DS_1$ or $DS_2$ signal occurs from a binary "1" data bit, it may occur when the respective "A" or "B" signal is at binary "0" and hence be inhibited from resetting the respective latch, since presumably the latch is already reset.) If a $DS_1$ or $DS_2$ pulse is not present when it ordinarily would have been (between consecutive "0" data bits), the $O_2$ or $O_1$ signal is substituted to reset the respective latch circuit. Thus, as illustrated at 116, a $DS_1$ signal was not present for ordinary reset of latch circuit 70 to set signal $L_1$ to binary "0". Instead, signal $L_1$ was reset by the $O_2$ signal. This occurs because during the presence of the $O_2$ signal (and absence of the $DS_1$ signal), NAND gate 24 receives a binary "1" input from NAND gate 34 and a "1" input $DS_1$ (due to the absence of a $DS_1$ "0" pulse). Since at this time the CB signal is binary "0", the input from inverter 16 to NAND gate 28 is binary "1". Also the LTD signal to NAND gate 28 is binary "1", so that when the binary "1"$O_2$ pulse is received by NAND gate 28, the conditions are present to force NAND gate 28 to a "0" output condition, thereby forcing the NAND gate 24 to its opposite mode and resetting latch 70. Similarly, when pulse $DS_2$ is not present, the $O_1$ signal feeding through NAND gate 48 resets latch circuit 72. Thus, the latch circuits 70 and 72 are continuously operated to provide pulses to the phase locked oscillator to thereby provide the $O_1$ and $O_2$ signals at the phase and frequency established by the preamble to the data.

With reference particularly to FIGS. 5A and 5B, during lock-to-data mode, the principle data paths are shown in heavy lines in FIG. 5A so that, as shown in FIG. 5B, both phase locked oscillators 78 and 80 are operated in tandem. Hence, PLO78 locks to 180° out of phase with the DS signal and PLO80 locks to 180° out of phase to PLO78 (and, hence, in phase with the DS signal). As shown in FIGS. 6A and 6B, the PLO's operate in unison with outputs from one PLO supplying missing DS pulses for the other PLO and vice versa.

With reference to FIGS. 7A and 7B, it is evident that during a "coasting" mode (i.e., when no data is fed into the apparatus), each PLO operates from the output of the other. Hence, during a coasting mode the apparatus will be selfsustaining to maintain the phase and frequency established during the lock-to-data or preamble mode.

With reference to FIGS. 1, 1A and 4, the operation of resynchronization can be explained. As shown in FIG. 4, there may occur a change in the data rate (frequency) of incoming data. Assume, for example, that the apparatus is locked to a data rate whereby the CB pulses have a repetition rate as shown in region 120. Assume further that the frequency decreases as shown in region 122. Latch signal $L_1$ will set to binary "1" with a binary "0" value to signal "A", and signal $L_2$ will set to binary "1" with a binary "0" value to signal "B", both as heretofore explained. Signal $L_1$ will be reset to binary "0" upon either the presence of a "0" valued $DS_1$ and signal or upon a "1" valued $O_2$ pulse. However, if signal $O_2$ appears as a "1" pulse when signal CB has a "1" value, latch 70 will not reset signal $L_1$ to binary "0". This occurs because the inverted CB pulse (inverted by inverter 16) will appear as a binary "0" to NAND gate 28 so the conditions would not be present to set NAND gate 28 to produce a "0" output. Instead NAND gate 28 produces a "0" output for input to latch circuit 70 only when all inputs are binary "1" (i.e., when signal $O_2$ is "1" and signal CB is "0"). Thus, as shown at dash line 124, an $O_2$ pulse would not reset the $L_1$ signal due to the "1" value of the CB signal. Likewise, $L_2$ will be reset to "0" upon either the presence of a "0" valued $DS_2$ signal or upon a "1" valued $O_1$ pulse and the simultaneous "0" valued CB pulse. (The "0" value to the CB pulse is again necessary because a "0" valued CB pulse will cause NAND gate 18 to produce a binary "1" output for NAND gate 48 which, when its other input receives a "1" valued $O_1$ pulse, will reset latch circuit 72 to produce an $L_2$ output with "0" binary value.) Thus, as illustrated at dashed line 126, the conditions are present for resetting signal $L_2$ to binary "0".

It can be shown that the condition illustrated at dashed line 124 in FIG. 4 will occur upon a decrease in frequency, and that the CB pulse will "blank out" or inhibit the $O_2$ pulse from resetting the $L_1$ pulse until the $L_1$ signal is in synchronization for ordinary running as shown in FIG. 3. It can likewise be shown that upon such decrease in frequency, the $DS_2$ pulses will be blanked out, or inhibited, from resetting the $L_2$ pulses due to the B pulse, as shown at dashed line 128. Thus, for the duration of a binary "0" B pulse to latch 72, the B pulse will hold the $L_1$ signal at binary "1" thereby overriding any attempt by the $DS_2$ pulse to reset the latch. (If the data included or consisted of binary "1"s instead of all "0"s as shown in the example of FIG. 4, the CB pulse would serve to blank the $0_1$ pulse to achieve the results noted in the foregoing.) The foregoing conditions are true, of course, for frequency changes of less than about 20-25%, which will be recognized by those skilled in the art to be beyond the drastic limits of "worst case" situations. In reality, frequency changes "drift" quite slowly and are relatively small. (It can also be shown that upon an increase in frequency, the $L_1$ and $L_2$ pulses would merely appear earlier to thereby resynchronize the apparatus.)

As will be evident by an inspection of the $L_1$ and $L_2$ signals, latch circuits 70 and 72 alter the pulse lengths, thereby altering the signals produced by the phase locked oscillators until they again lock to the frequency of the data rate in phase (or 180° out of phase, in the case of signal $O_1$ and "A") to the DS signals.

As shown in FIGS. 1 and 1A, the "A" and "B" pulses are produced by single shot multivibrators 44 and 64 simultaneously with signal $O_1$ and $O_2$, respectively. However, it is preferred that the output signal pulses "A" and "B" be of significantly longer duration than the $O_1$ and $O_2$ signal pulses. The longer "A" and "B" pulses are desired for clock purposes, as well as for the resynchronization aspect above described. Thus, the "A" and "B" signals are useful as clock pulses for the data being read from a magnetic or other medium. During start-up (or lock-to-data mode), the "A" and "B" pulses are not long, due to the inhibiting of AND gates 30 and 32, so the "A" and "B" signals will merely be an inversion of the $O_1$ and $O_2$ signals, respectively, as passed by NOR gates 46 and 62.

The present invention is also useful for establishing clock signals for data writing operations and other purposes. In this respect, the data rate may be established as heretofore described and a clock signal may be extracted from the output of OR gate 48. The output will be a series of pulses at twice the frequency of the data rate. Further, if desired, the data rate necessary to sustain and adjust the oscillation frequency may thereafter be reduced to a subharmonic of the frequency of the $O_1$ and $O_2$ pulses, without deteriorating the operation. In this latter respect, then, the apparatus may be used for frequency multiplication purposes.

As will be evident to those skilled in the art, additional data may be superimposed onto the data embodied in the recorded data via modulation techniques whereby the data rate is modulated by additional signals representative of additional data. This modulation frequency may be extracted from filters 38 and 56 of the present invention.

The present invention thus provides a phase locked oscillator employing dual loops whereby a high degree of accuracy and versatility is achieved. The apparatus is effective in operation and accurately tracks the necessary data rates.

This invention is not to be limited by the embodiment shown in the drawings and described in the description, which is given by way of example and not of limitation, buy only in acccordance with the scope of the appended claims.

What is claimed is:

1. A phase locked oscillator system for producing output pulse signals at a frequency locked to an input data rate, comprising: first gate means for producing a first latch signal consisting of a plurality of pulses; second gate means for producing a second latch signal consisting of a plurality of pulses; first phase locked oscillator means responsive to said first latch signal for producing a first output pulse signal having a frequency representative of the pulse frequency of said first latch signal; second phase locked oscillator means responsive to said second latch signal for producing a second output pulse signal having a frequency representative of the pulse frequency of said second latch signal; input circuit means responsive to input data for producing a first input pulse signal; said first gate means being responsive to said first output pulse signal for producing said first latch signal having a first binary value and selectively responsive to said first input pulse signal and said second output pulse signal for producing said first latch signal having a second binary value; and said second gate means being responsive to said second output pulse signal for producing said second latch signal having a first binary value and selectively responsive to said first input pulse signal and said first output pulse signal for producing said second latch signal having a second binary value.

2. Apparatus according to claim 1 further including means for producing a lock-to-data signal, first inhibit means responsive to said lock-to-data signal for inhibiting said first gate means from responding to said second output pulse signal, and second inhibit means responsive to said lock-to-data signal for inhibiting said second gate means from responding to said first input pulse signal, whereby upon operation of said first and second inhibit means said first phase locked oscillator means becomes locked to the input data rate to produce said first output pulse signal at the frequency of said data rate and 180° out of phase with said first input pulse signal and said second phase locked oscillator becomes locked to the first output pulse signal to produce said second output pulse signal at the frequency of said data rate and in phase with said first input pulse signal.

3. Apparatus according to claim 2 wherein said input circuit means includes first circuit means responsive to said input data for producing a second input pulse signal and second circuit means responsive to said second input pulse signal for producing said first input pulse signal, third inhibit means operable to inhibit said second latch means from responding to said first output pulse signal, said first and third inhibit means being operable in response to said second input pulse signal to inhibit the respective first and second latch means.

4. Apparatus according to claim 1 further including third gate means connected to said first and second phase locked oscillator means for producing a third output signal which is a combination of said first and second output signals.

5. Apparatus according to claim 2 further including third gate means connected to said first and second phase locked oscillator means for producing a third output signal having a frequency of twice said data rate.

6. Apparatus according to claim 3 further including third gate means connected to said first and second phase locked oscillator means for producing a third output signal having a frequency of twice said data rate.

7. A phase locked oscillator system comprising, in combination:

first multivibrator means responsive to input data pulses for producing a first pulse signal having a first binary value;

second multivibrator means responsive to the lagging edge of said first pulse signal for producing a second pulse signal having a first binary value;

first inverter means for inverting said first pulse signal;

second inverter means for inverting said second pulse signal;

first gate means having first, second and third inputs, said first gate means being responsive to a signal having a second binary value at any of its inputs to produce a signal output having a first binary value, and responsive to signals having a first binary value at all of its inputs to produce a signal output having a second binary value;

means connecting the output of said first inverter means to a first of said inputs of said first gate means;

means for producing a lock-to-data signal;

means connecting said last-named means to the second of said inputs of said first gate means;

first latch means having first, second and third inputs, said first latch means being responsive to a signal having a second binary value at its first input to produce a first latch signal having a first binary value, said first latch means being further responsive to a signal having a second binary value at either of its second and third inputs to produce a first latch signal having a second binary value;

means connecting the output of said first gate means to a second input of said first latch means;

means connecting the output of said second inverter means to a third input of said first latch means;

second gate means having a first input connected to said first multivibrator means to receive said first pulse signal and having a second input connected to receive said lock-to-data signal, said second gate means being responsive to a signal having a second binary value at either of its inputs to produce a signal output having first binary value, and responsive to signals having a first binary value at both of its inputs to produce a signal output having a second binary value;

third gate means having a first input connected to said second multivibrator means to receive said second pulse signal and having a second input connected to receive said lock-to-data signal, said third gate means being responsive to a signal having a second binary value at either of its inputs to produce a signal output having a first binary value, and responsive to signals having a first binary value at both of its inputs to produce a signal output having a second binary value;

fourth gate means having first and second inputs, said fourth gate means being responsive to a signal having a second binary value at either of its inputs to produce a signal output having a first binary value, and responsive to signals having a first binary value at both of its inputs to produce a signal output having a second binary value;

means connecting the output of said second gate means to the first input of said fourth gate means;

second latch means having first, second and third inputs, said second latch means being responsive to a signal having a second binary value at its first input to produce a second latch signal having a first binary value, said second latch means being further responsive to a signal having a second binary value at either of its second and third inputs to produce a second latch signal having a second binary value;

means connecting the output of said third gate means to said second input of said second latch means;

means connecting the output of said fourth gate means to the third input of said second latch means;

first voltage producing means responsive to said first latch signal for generating a first voltage signal;

second voltage producing means responsive to said second latch signal for generating a second voltage signal;

first voltage controlled oscillator means responsive to said first voltage signal for producing a third pulse signal having a frequency representative of the voltage of said first voltage signal;

second voltage controlled oscillator means responsive to said second voltage signal for producing a fourth pulse signal having a frequency representative of the voltage of said second voltage signal;

third miltivibrator means connected to said first voltage controlled oscillator means and responsive to pulses having said first binary value for producing a fifth pulse signal having a first binary value;

fourth multivibrator means connected to said second voltage controlled oscillator means and responsive to pulses having said first binary value for producing a sixth pulse signal having a first binary value;

means connecting the output of said third multivibrator means to the second input of said fourth gate means;

means connecting the output of said fourth multivibrator means to the third input of said first gate means;

fifth gate means having a first input connected to receive said third pulse signal and having a second input connected to receive said lock-to-data signal, said fifth gate means being responsive to signals having said first binary value at both of its inputs to produce an output signal having a first binary value, and responsive to a signal having said second binary value at either of its inputs to produce an output signal having a second binary value;

sixth gate means having a first input connected to receive said fourth pulse signal and having a second input connected to receive said lock-to-data signal, said sixth gate means being responsive to signals having said first binary value at both of its inputs to produce an output signal having said first binary value, and responsive to a signal having said second binary value at either of its inputs to produce an output signal having a second binary value;

fifth multivibrator means connected to said fifth gate means and responsive to signals having said first binary value for producing a seventh pulse signal having a first binary value;

sixth multivibrator means connected to said sixth gate means and responsive to signals having said first binary value for producing an eighth pulse signal having a first binary value;

seventh gate means having a first input connected to said third multivibrator means and having a second input connected to said fifth multivibrator means, said seventh gate means being responsive to signals having said second binary value at both of its inputs to produce an output signal having a first binary value, and responsive to a signal having a first binary value at either of its inputs to produce an output signal having a second binary value;

eighth gate means having a first input connected to said fourth multivibrator means and having a second input connected to said sixth multivibrator means, said eighth gate means being responsive to signals having said second binary value at both of its inputs to produce an output signal having a first binary value, and responsive to a signal having a first binary value at either of its inputs to produce an output signal having a second binary value;

means connecting the output of said seventh gate means to the first input of said first latch means; and means connecting the output of said eighth gate means to the first input of said second latch means.

8. Apparatus according to claim 7 wherein each of said first, second, third and fourth gate means is a NAND gate, each of said fifth and sixth gate means is an AND gate, and each of said seventh and eighth gate means is a NOR gate.

9. Apparatus according to claim 7 wherein said first latch means comprises ninth gate means having first, second and third inputs, and tenth gate means having first and second inputs, the first input of said first latch means being connected to the first input of said tenth gate means, the second input of said first latch means being connected to the first input of said ninth gate means and the third input of said first latch means being connected to the second input of said ninth gate means, means connecting the output of said ninth gate means to the second input of said tenth gate means, means connecting the output of said tenth gate means to the third input of said ninth gate means, said first latch signal being produced at the output of said tenth gate means; and said second latch means comprises eleventh gate means having first, second and third inputs and twelfth gate means having first and second inputs, the first input of said second latch means being connected to the first input of said twelfth gate means, the second input of said second latch means being connected to the first input of said eleventh gate means, the third input of said second latch means being connected to the second input of said eleventh gate means, means connecting the output of said eleventh gate means to the second input of said twelfth gate means, means connecting the output of said twelfth gate means to the third input of said eleventh gate means, and said second latch signal being produced at the output of said twelfth gate means.

10. Apparatus according to claim 9 wherein each of said first, second, third, fourth, ninth, tenth, eleventh and twelfth gate means is a NAND gate, each of said fifth and sixth gate means is an AND gate, and each of said seventh and eighth gate means is a NOR gate.

11. Apparatus according to claim 9 further including thirteenth gate means having a first input connected to the output of said third multivibrator means and having a second input connected to the output of said fourth multivibrator means, said thirteenth gate means being responsive to a signal having a first binary value at either of its first and second inputs to produce a signal output having said first binary value.

12. Apparatus according to claim 11 wherein each of said first, second, third, fourth, ninth, tenth, eleventh and twelfth gate means is a NAND gate, each of said fifth and sixth gate means is an AND gate, each of said seventh and eighth gate means is a NOR gate, and said thirteenth gate means is an OR gate.

13. Apparatus according to claim 7 further including thirteenth gate means having a first input connected to the output of said third multivibrator means and having a second input connected to the output of said fourth multivibrator means, said thirteenth gate means being responsive to a signal having a first binary value at either of its first and second inputs to produce a signal output having said first binary value.

14. Apparatus according to claim 13 wherein each of said first, second, third and fourth gate means is a NAND gate, each of said fifth and sixth gate means is an AND gate, each of said seventh and eighth gate means is a NOR gate, and said thirteenth gate means is an OR gate.

15. The method of generating an output pulse signal consisting of a plurality of pulses having a frequency equal to the frequency of an input data rate, comprising the steps of:
  providing a first plurality of input pulses at the frequency of said input data rate;
  locking a first phase oscillator to the frequency of said first plurality of input pulses to provide a first output pulse signal;
  locking a second phase locked oscillator to the frequency of said first output pulse signal to provide a second output pulse signal;
  subsequently providing a second plurality of input pulses representative of data;
  maintaining the oscillation of said first phase locked oscillator by selectively locking said first phase locked oscillator to either said second plurality of input pulses or to said second output pulse signal; and
  maintaining the oscillation of said second phase locked oscillator by selectively locking said second phase locked oscillator to either said second plurality of input pulses or to said first output pulse signal.

16. The method of generating an output pulse signal consisting of a plurality of pulses having a frequency equal to the frequency of an input data rate, comprising of steps of:
  providing a plurality of input pulses representative of data, said data having a predetermined data rate frequency;
  locking a first phase locked oscillator to the data rate frequency to provide a first output pulse signal at the frequency of said data rate frequency;
  locking a second phase locked oscillator to the frequency of said first output pulse signal to provide a second output pulse signal at the frequency of said first output pulse signal and 180° out of phase with said first output pulse signal;
  maintaining the oscillation of said first phase locked oscillator by selectively locking said first phase locked oscillator to either said input pulses or to said second output pulse signal; and
  maintaining the oscillation of said second phase locked oscillator by selectively locking said second phase locked oscillator to either said input pulses or to said first output pulse signal.

* * * * *